United States Patent [19]
Yokomi et al.

[11] Patent Number: 5,370,846
[45] Date of Patent: Dec. 6, 1994

[54] APPARATUS AND METHOD FOR GENERATING HIGH CONCENTRATION OZONE

[75] Inventors: Tetsusuke Yokomi; Jiro Kobayashi; Suguru Nakatsuka, all of Amagasaki, Japan

[73] Assignee: Sumitomo Precision Products Co., Ltd., Hyogo, Japan

[21] Appl. No.: 56,939

[22] Filed: May 5, 1993

Related U.S. Application Data

[63] Continuation of Ser. No. 603,436, Oct. 26, 1990, abandoned.

[51] Int. Cl.⁵ .............................................. B01J 19/08
[52] U.S. Cl. ........................ 422/186.07; 422/186.08; 422/186.14
[58] Field of Search ............... 422/186.08, 186.14, 422/186.07

[56] References Cited

U.S. PATENT DOCUMENTS

| | | | |
|---|---|---|---|
| 4,062,748 | 12/1977 | Imris | 204/176 |
| 4,430,306 | 2/1984 | Namba et al. | 422/292 |
| 4,954,321 | 9/1990 | Jensen | 422/186.19 |
| 5,047,127 | 9/1991 | Tottori et al. | 204/176 |
| 5,063,030 | 11/1991 | Sweetman | 422/189 |

FOREIGN PATENT DOCUMENTS

| | | | |
|---|---|---|---|
| 3427274 | 1/1986 | Germany | 422/186.08 |
| 1282104 | 11/1989 | Japan . | |
| 0803724 | 10/1958 | United Kingdom | 422/186.08 |

OTHER PUBLICATIONS

Brewer, A. Keith and J. W. Westhaver, "Chemical Action in the Glow Discharge IV. The Synthesis of Ozone" Jun., 1930, pp. 1280–1293.

*Primary Examiner*—Donald P. Walsh
*Assistant Examiner*—Chrisman D. Carroll
*Attorney, Agent, or Firm*—Oblon, Spivak, McClelland, Maier & Neustadt

[57] ABSTRACT

A system and method for generating high concentration ozone by introducing a high purity oxygen (99.995% or greater purity) into a silent discharge type ozone generator. Another high purity gas (99.99% or greater), is mixed with the oxygen before the gas is introduced into the ozone generator. By this process, high concentration ozone is generated such that the ozone concentration does not decrease with time. The highest ozone concentrations are maintained when the non-oxygen gas makes up between 1% and 10% of the volume content of the gas mixture introduced in the ozone generator.

8 Claims, 6 Drawing Sheets

APPARATUS AND METHOD FOR GENERATING HIGH CONCENTRATION OZONE

This application is a continuation of application Ser. No. 07/603,436, filed on Oct. 26, 1990, now abandoned.

BACKGROUND OF THE INVENTION

1. Field of the Invention

The invention relates to an improvement for generating high concentration ozone. High concentration ozone is known to be useful in removing photoresist from silicon wafers during semiconductor manufacturing processes.

2. Background of the Related Art

In manufacturing semiconductors, a process called photoetching is often employed for forming any wiring pattern on a silicon wafer on a micron unit basis. Normally, this process is repeated about 30 times and every time, ashing, a step for removing photoresist (a photosensitive resin), is required; therefore, an ashing device is indispensable.

As the ashing device, hitherto, a device making use of plasma has been in use. According to this method, plasma discharge is brought about with oxygen gas introduced into vacuum, to thereby physically remove the photoresist. But with growing degrees of integration, plasma irradiation and heavy metal pollution have become problems at the high temperature condition inherent in these ashing devices.

Recently, because of its cleanliness, powerful oxidizing action, rapid reactivity, etc., ozone's sphere of utilization has been expanded from sterilization and purification to include photoresist removal in the semiconductor manufacturing process.

In an ashing device based on use of ozone, high concentration ozone generated by an ozone generating system is brought into contact with the wafer surface, to chemically convert the photoresist into such gases as $H_2O$, $N_2$, $CO_2$, etc., thereby removing it. Its work involves no risk of impairing the wafer surface nor of causing heavy metal pollution. Thus it shows quite excellent adaptability to ashing.

Typical of an ozone generating system capable of generating ozone on an industrial scale is a system of silent discharge type in which a dielectric is placed between a pair of electrodes, a high a-c voltage is impressed between these electrodes, and oxygen is passed through a discharge space created between the electrodes, thereby generating ozone.

When such an ozone generating system of the silent discharge type is used for the ashing device, it is important to generate high concentration ozone by this ozone generating system. The removing rate of photoresist is influenced by the concentration of ozone and the temperature at the time of reaction. Therefore, in order to avoid high temperature, which tends to cause wafer damage, use of ozone with as high a concentration as possible is required.

When generating high concentration ozone in the ozone generating system of the silent discharge type, generally, liquefied oxygen is used as the raw material. However, when liquefied oxygen is used, metal dust or metal ions, etc., exist in the ozone gas produced. These impurities stick on the surface of the silicon wafer while it is undergoing ozone treatment. They then permeate from the wafer surface into its interior, thereby altering the crystal structure and the electrical characteristics of the wafer, thus decreasing the quality of the wafer.

The development trend of process is such that in making growth of $S_iO_2$.PSG (insulating film), gases like monosilane, oxygen or phosphine have been selected and used, but recently, TEOS+$O_3$ system has been tried both in the normal pressure and reduced pressure CVD apparatuses. This system is characterized by its ability of making growth with excellent coverage over any stepped part with high aspect ratio.

The CVD apparatus is an apparatus for forming a desired thin film through chemical reaction performed in gas phase or on the wafer surface, with one or several types of compound gases comprising the element which composes the CVD (chemical vapor deposition) system thin film material or the element gas fed onto the wafer. For exciting the gas molecules, heat energy or plasma discharge should be utilized. Normal pressure CVD apparatus. Reduced pressure CVD apparatus.

It has been proposed to use a high purity oxygen of the type having a purity in excess of 99.995% rather than liquid oxygen, which has a purity of only about 99.740%. Although this substantially eliminates impurities sticking to the surface of the wafer, it has turned out that when the aforementioned high purity oxygen is supplied as the material into the ozone generating system of the silent discharge type, the ozone concentration decreases with the passage of time, and the system therefore loses its capability to function as a high purity ozone generating system.

SUMMARY OF THE INVENTION

It is, therefore, an object of this invention to provide a high purity ozone generating system adapted for prevention of the phenomenon of ozone concentration decrease with time when high purity oxygen is used in an ozone generating system of the silent discharge type.

It is a further object of the present invention to provide a method of generating high purity ozone using such a system.

In the system of this invention, while connecting a high purity oxygen source for oxygen supply to an ozone generator of silent discharge type through an oxygen feeding pipe, a source of any of high purity gases other than the high purity oxygen is connected to the aforementioned oxygen feeding pipe through a mixing mechanism.

According to the method of this invention, being a method of generating high purity ozone using the aforementioned system, the content of the high purity gas other than the high purity oxygen relative thereto is set at 1.0–10.0% by volume.

The cause of the phenomenon of ozone concentration decrease with time, which is called into question, when high purity oxygen is used in an ozone generating system of silent discharge system, is uncertain. However, since this is a phenomenon which has not occurred when liquefied oxygen is used as the material, the cause is conjectured to be difference in material. From this standpoint, the present inventors, as a result of investigation on the measure for prevention of the aforementioned phenomenon of concentration decrease, gained a knowledge that supplying, together with the high purity oxygen, any of high purity gases other than the high purity oxygen at a content of 1.0–10.0% by volume thereof is effective.

By the system and the method of this invention, it is possible to prevent the phenomenon of ozone concentration decrease with time, which is called into question, when high purity oxygen is used, by supplying, together with any of high purity gases other than the high purity oxygen at a content of 1.0–10.0% by volume thereof.

The high purity oxygen means an oxygen gas with higher than 99.995% purity as here above described.

As the high purity gas, any gas other than the high purity oxygen can be used. Carbon dioxide ($CO_2$), argon (Ar), nitrogen ($N_2$), helium (He), or any inert gas could be used, for example. However, any gas containing impurities lowers the quality of the silicon wafer in the ashing device; therefore, the purities of any gases used must be on the same level as the high purity oxygen.

The reason why the phenomenon of ozone concentration decrease with time is prevented by having contained in the high purity oxygen any of high purity gases other than the high purity oxygen is not certain. But it has been experimentally confirmed that if this content is not more than 1.0% by volume, the phenomenon of ozone concentration decrease with time can not be adequately inhibited and conversely, if it is higher than 10.0% the overall level of the ozone concentration does not increase and the economic disadvantage due to supply of a large amount of gas raises a problem.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

Figure 1:
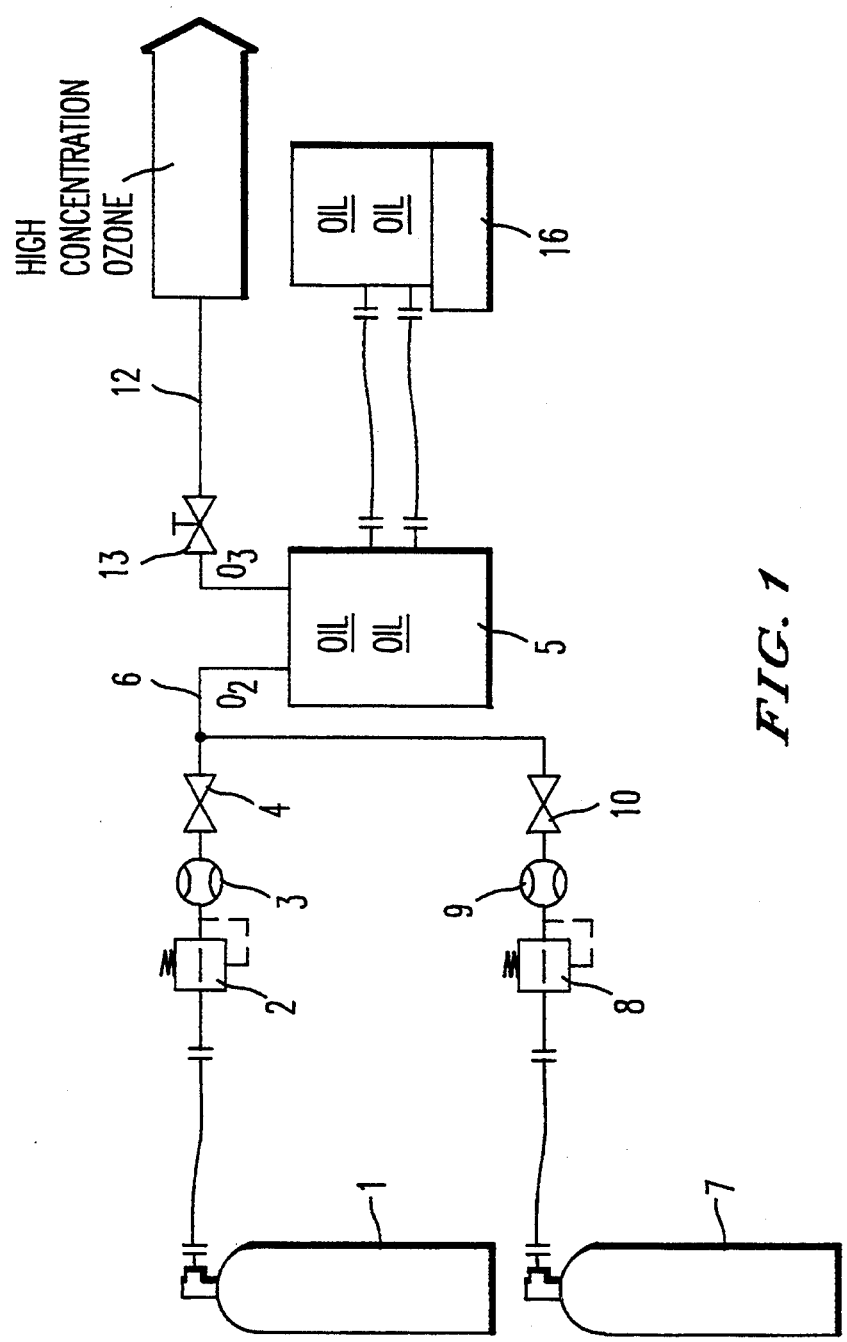
FIGS. 1 and 2 are schematic representations of the operation of the system embodying this invention.
Figure 2:
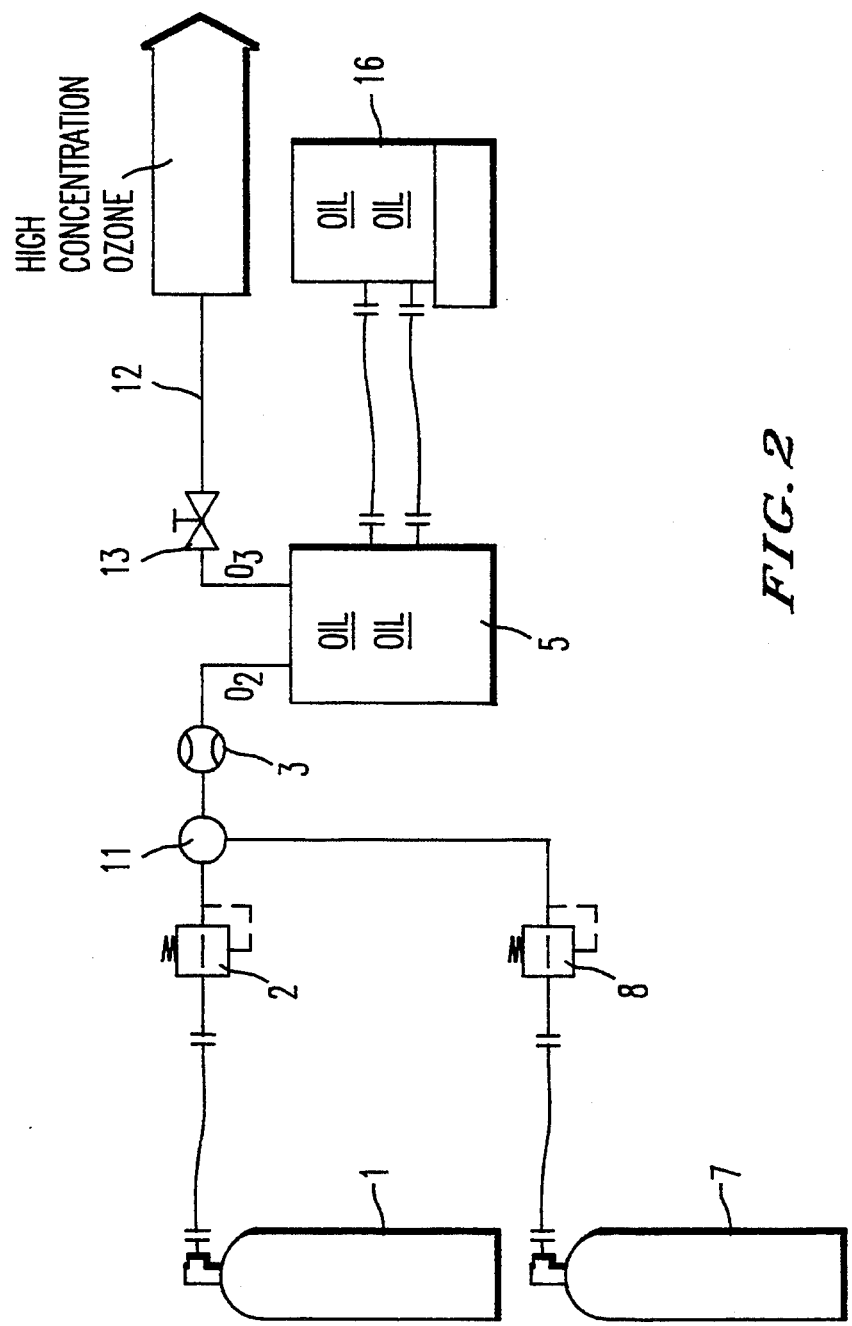

Referring now to the drawings, wherein like reference numerals designate identical or corresponding parts throughout the several views, and more particularly, to FIG. 1 thereof, a cylinder 1, a high concentration oxygen source, is connected by an oxygen feeding pipe 6 to an ozone generator 5 via a reduction valve 2, flowmeter 3 and a flowrate control valve 4. Another cylinder 7, a source for supplying a high purity gas other than the high purity oxygen, is connected to the aforementioned oxygen feeding pipe 6 downstream of the flowrate control valve 4 via a reduction valve 8, flowmeter 9 and a flowrate control valve 10. The two flowrate control valves 4 and 10 compose a mixing mechanism, but in place of them, an independent mixer 11 may be interposed between them at a junction, as shown in FIG. 2. Numeral 12 denotes a high concentration ozone delivering pipe and 13 represents a valve provided in the pipe 12.

Figure 3:
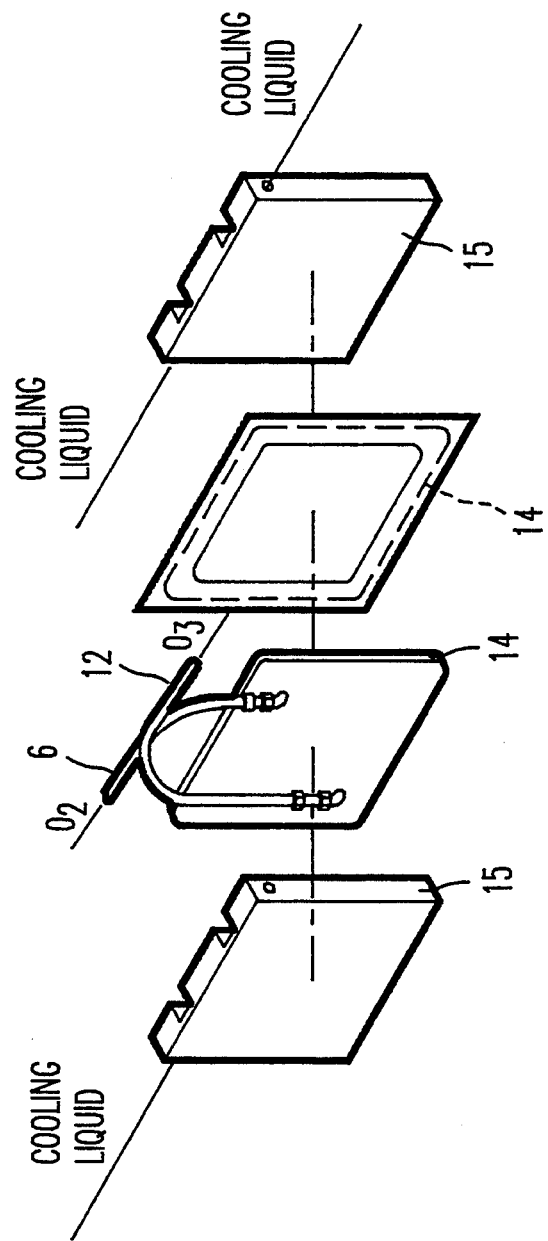
FIG. 3 is an expanded view of a discharge cell provided in FIGS. 1 and 2.

The discharge cell provided in the ozone generator 5 is of a structure as shown in FIG. 3 such that two sheets of electrode plates 14, 14 are arranged facing each other at a specified distance and, further, they are sandwiched by a pair of coolers 15, 15.

As the material oxygen is fed through the material oxygen feeding pipe 6, while producing a discharge between the electrode plates 14, 14, the oxygen fed is ozonized and the high concentration ozone is drawn out through the outlet pipe 12, while the discharge plates 14, 14 are cooled by the insulating oil fed to the coolers 15, 15, thereby effecting increase in the ozone concentration. The insulating oil fed to the coolers 15, 15 is circulated to and from a heat exchanger, where it is gradually heated by cooling water.

Figure 4:
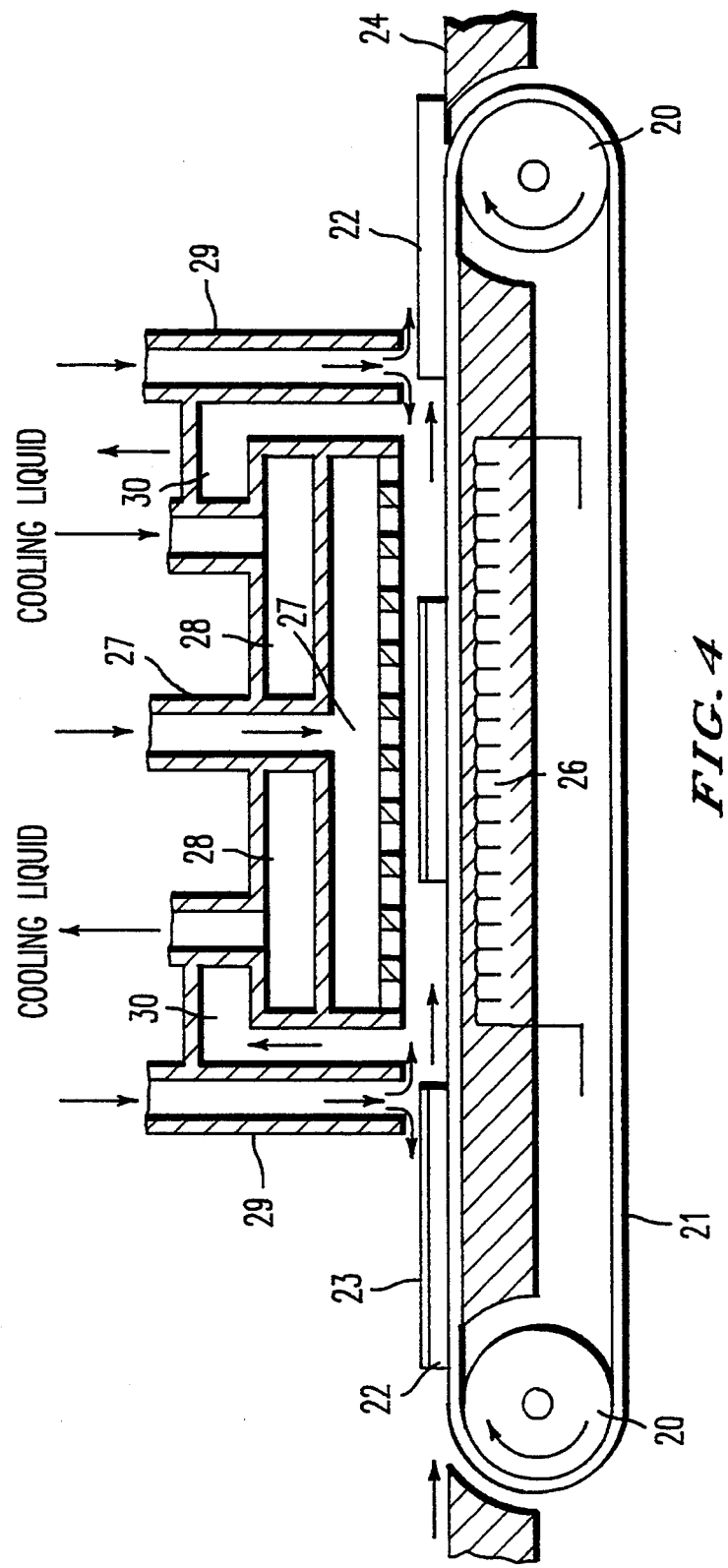
FIG. 4 is a sectional view illustrating the structure of an ashing device based on the use of ozone.

FIG. 4 is a sectional view illustrating a structure of an ashing device operating with ozone.

By the drive of the belt 21 stretched between wheels 20, 20, a semiconductor substrate 22 is moved on a track 24, with the resist layer 23 turned upward. Upward of this moving path, an ozone space 25 is arranged with its blow-out holes turned downward. In the track 24, a heating resistor wire 26 is embedded in a posture of facing the ozone space 25.

A structure is provided in which the ozone space 25 is provided with a high concentration ozone introducing pipe 27, to which is connected a high concentration ozone delivering pipe (designated by 12 in FIGS. 1 and 2) of the ozone generating system; on the other hand, it is provided with a cooling jacket 28 and, further, with a gas purging section 29 for shielding the surrounding with an inert gas ($N_2$ gas) added, forming a gas exit 30 between the ozone space 25 and the gas purging section 29.

The semiconductor substrate 22 which is moving on the track 24, with the resist layer 23 turned upward, is deprived of the resist layer 23 by the high concentration ozone blown out from the ozone space 25 in the process of its passing downward of the ozone space 25.

Using the system of the invention shown in FIG. 1, while energizing and cooling the ozone generator 5, an oxygen gas from liquefied oxygen, an oxygen gas with such a high purity as above 99.995%, was fed through an oxygen feeding pipe 6. Besides, the high purity oxygen gas having each of 4 types of mixed gases respectively with 1.5% by volume content of high purity (99.99%) Ar, $H_2$, He and $CO_2$ was fed. The liquefied oxygen gas is as specified by JIS K1101. The composition analysis results of the liquefied oxygen and the high purity oxygen marketed as a 99.995% pure product are given in Table 1. The specification of the ozone generator and its operating conditions are as given in Table 2.

TABLE 1

| | (Ratio by volume) | |
|---|---|---|
| | Liquefied oxygen as per JIS K1101 | 99.995% High purity oxygen |
| $O_2$ | 99.740% | 99.998% |
| Ar | $255 \times 10^4$ ppb | 360 ppb |
| $N_2$ | $487 \times 10^2$ ppb | $151 \times 10^2$ ppb |
| CO | 37.4 ppb | 33.4 ppb |
| $CO_2$ | 589 ppb | 135 ppb |
| $H_2$ | 7.91 ppb | 9.04 ppb |
| $H_2O$ | 812 ppb | 524 ppb |
| THC (*) | $461 \times 10$ ppb | 14.6 ppb |

(*) Total hydrocarbon

TABLE 2

| Electrode | |
|---|---|
| High voltage side | Dielectric coating metal |
| Low voltage side | Dielectric coating metal |

TABLE 2-continued

| Cooling method | Both poles oil-cooled at 15° C. |
| --- | --- |
| Discharge voltage | 3 KV |
| Discharge frequency | 1200 Hz |
| Discharge gap | 0.8 mm |
| Discharge power density | 0.7 W/cm² |
| Power source | Transistor inverter |
| Yield controlling method | Discharge current value control |
| Material oxygen flowrate | 10 Nl/min |

When liquefied oxygen is used as the material, a decrease in the ozone concentration does not take place even after a lapse of 2 hours, after starting the operation, but when the high purity oxygen only is used, the desired concentration is secured only just after starting the operation; the concentration decreases with passage of the operation time, going down to about ½ the initial concentration 2 hours later.

However, with a material of the high purity oxygen having 1.5% by volume of a high purity gas other than the high purity oxygen, no concentration decrease with time takes place; thus, similar concentration stability as with the liquefied oxygen as the material is ensured.

Figure 6:
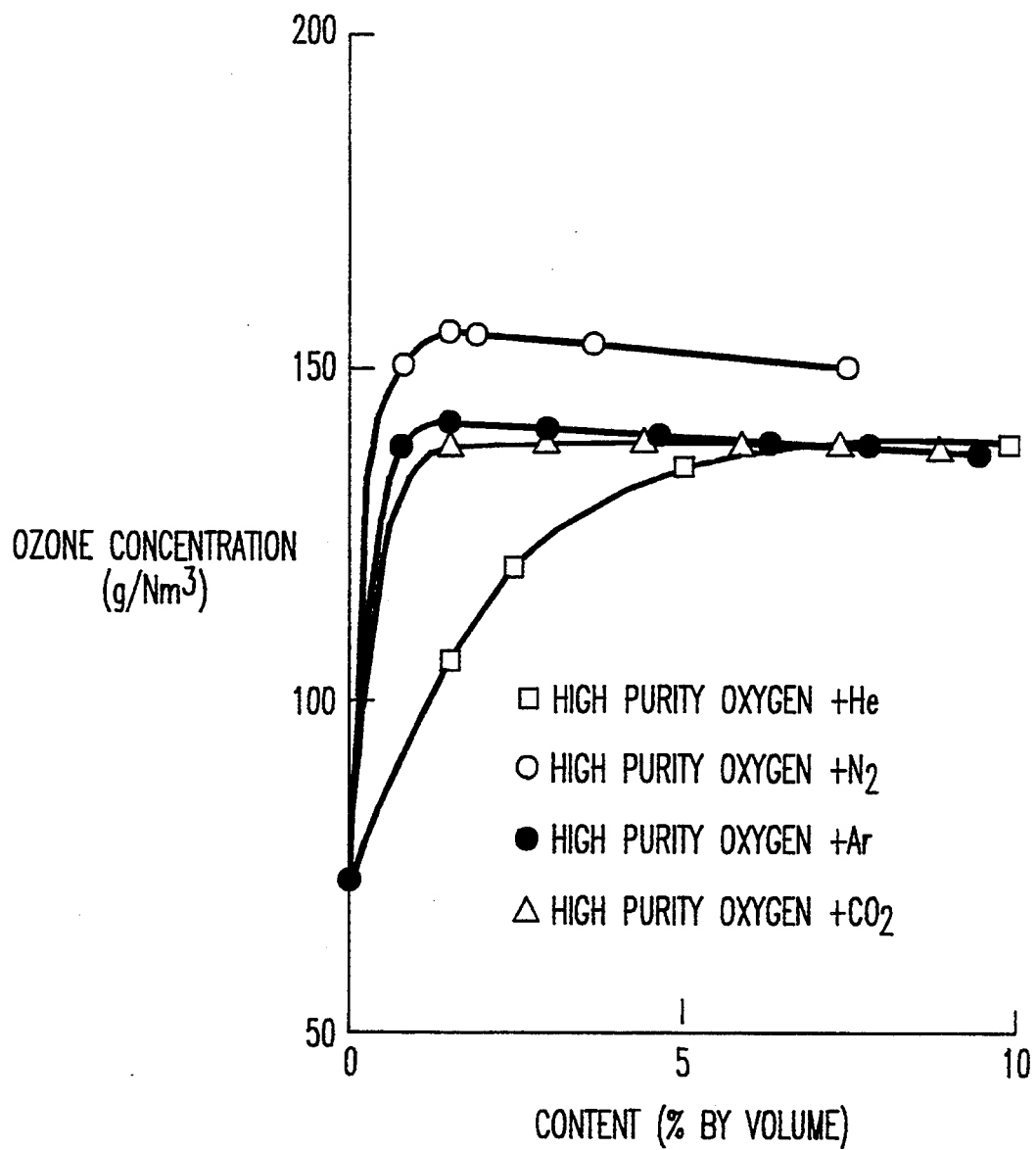

Besides, shown in FIG. 6 is the relationship between the ozone concentration (just after starting the operation) and the content of the high purity gas other than the high purity oxygen, when any one of Ar, $N_2$, He and $CO_2$ as such a gas is contained in the high purity oxygen at varying concentrations.

When a mixture of high purity oxygen and another high purity gas is provided, the ozone concentration rises, as compared with when the high purity oxygen (0% by volume added gas content) only is employed. However, adequate rising effect is obtained only up to 10% by volume content. When the added gas exceeds 10% by volume, the rising effect is saturated, with resultant lost economy.

Figure 5:
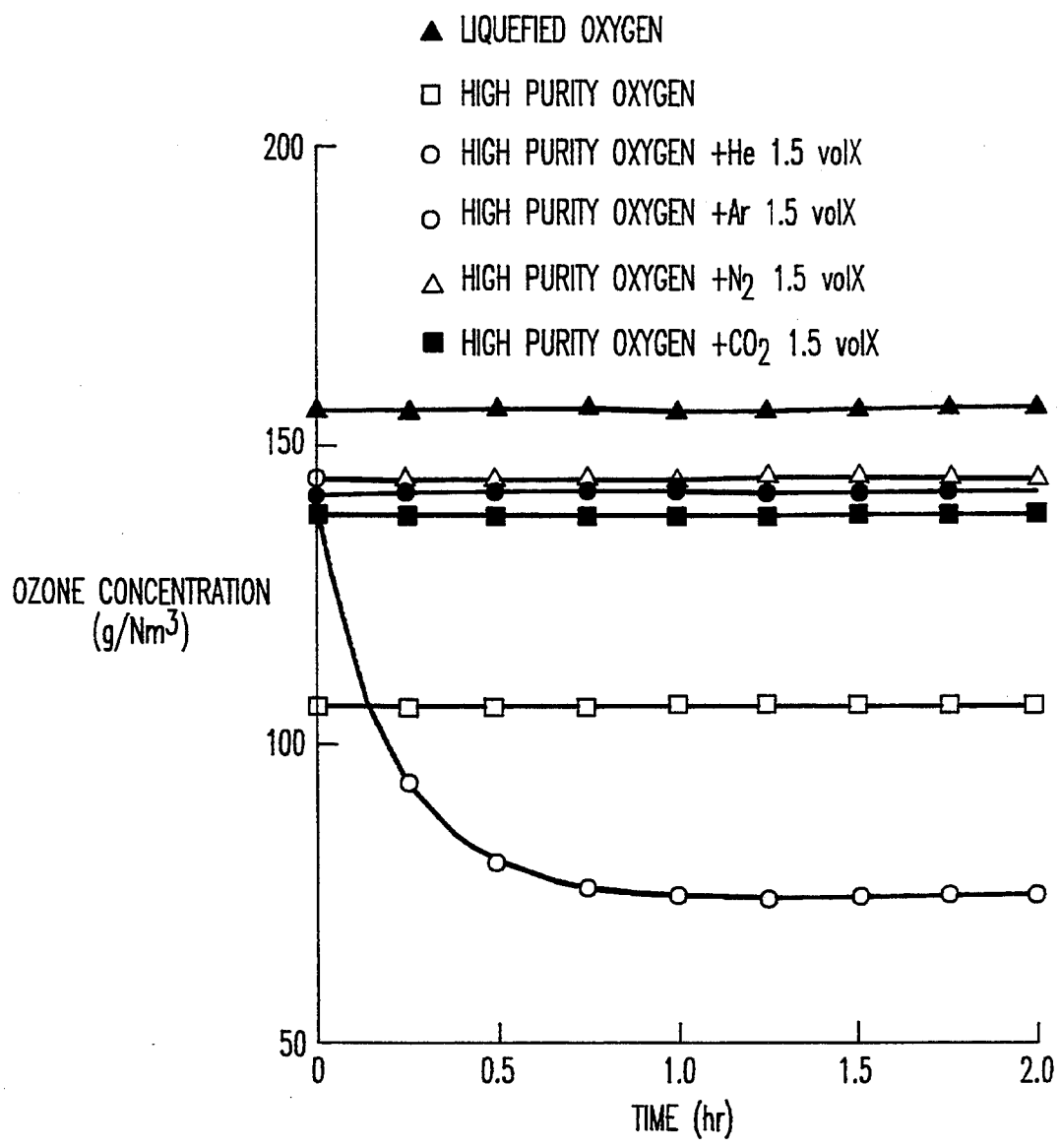
FIGS. 5 and 6 are graphs showing how the use of different gases in combination with oxygen affect the concentration of ozone produced.

The ozone concentrations of the high concentration ozone which flowed out through the outlet pipe 12 were measured, when each of the four respective gases was mixed just after starting the operation, 0.5, 1 and 2 hours later, respectively. The results are shown in Table 3 and FIG. 5.

TABLE 3

| | Ozone concentration (% by volume) | | | |
| --- | --- | --- | --- | --- |
| | Just after starting operation | 0.5 hr later | 1 hr later | 2 hr later |
| Liquefied oxygen | 143.2 | 143.3 | 143.0 | 143.1 |
| High purity oxygen | 143.5 | 80.3 | 74.5 | 74.6 |
| High purity oxygen + 1.5 vol % Ar | 141.6 | 141.3 | 141.5 | 141.7 |
| High purity oxygen + 1.5 vol % $N_2$ | 155.1 | 155.2 | 155.1 | 155.3 |
| High purity oxygen + 1.5 vol % He | 105.9 | 106.2 | 106.0 | 106.0 |
| High purity oxygen + 1.5 vol % $CO_2$ | 137.8 | 137.5 | 137.7 | 137.8 |

With the addition of $N_2$, Ar or $CO_2$, a maximum ozone concentration is obtained in the range of its 1.0–2.0% by volume content. Thus content falling in this range is desirable.

According to this invention concerning the system and the method for ozone generation, the phenomenon of ozone concentration decrease with time is prevented by mixing with the high purity oxygen a content of any gas other than this oxygen. Further, as the gas content is limited, no phenomenon of overall ozone concentration decrease due to the mixed gas content takes place at all; rather, adequate concentration rising effect is obtained. Besides, since a high purity gas is used as the mixed gas content, any metal dust or metal ions and other impurities will not be newly added to the high concentration ozone. Accordingly, for example, when used with the ashing device, this system serves to provide for surface protection of the silicon wafer, does not cause degradation of the quality in the facets of crystal structure and electric characteristics and guarantees long stable operation, thereby assuring large effects in improvements in manufacturing efficiency and quality.

Obviously, numerous modifications and variations of the present invention are possible in light of the above teachings. It is therefore to be understood that within the scope of the appended claims, the invention may be practiced otherwise than as specifically described herein.

What is claimed is:

1. A method of generating high-purity and high-concentration ozone which substantially does not change with a lapse of time, in which, in a silent discharge ozonizer, oxygen having a purity of 99.995% or more as an oxygen source is connected with an oxygen supply pipe while a gas source of nitrogen, helium, argon or carbon dioxide having a purity of 99.99% or more is connected with said oxygen supply pipe through a mixing mechanism so that a content of said gas other than oxygen in the oxygen may amount to 1.0 to 10.0% by volume.

2. The system for generating high concentration ozone according to claim 1, where the second gas is argon.

3. A system for generating high concentration ozone which substantially does not change with a lapse of time, comprising:

a high pressure, high purity oxygen source providing oxygen of a purity higher than 99.995% to an oxygen feeding pipe;

a reduction valve for reducing the pressure of said high purity oxygen in said oxygen feeding pipe;

a mixer for receiving the high purity oxygen passing through the reduction valve;

a source of a high pressure, high purity second gas of nitrogen, helium, argon or carbon dioxide connected to the mixer, to provide the second gas thereto, said second gas having a purity higher than 99.99%;

a reduction valve connected between the source of the second gas and the mixer for reducing the pressure of said second gas provided to said mixer;

wherein the mixer mixes the high purity oxygen with said second gas so that a content of the second gas is 1% to 10% by volume;

a flow meter for measuring the flow of said gas mixture through said mixer, the flow meter being located at a location downstream of said mixer; and a silent discharge type ozone generator connected to said oxygen feeding pipe downstream of said mixer for ozonizing said gas mixture to yield an ozone concentration which does not decrease over time.

4. The system for generating high concentration ozone according to claim 3, where the second gas is argon.

5. A method of generating high concentration ozone which does not substantially decrease over time, comprising the steps of:

supplying high pressure oxygen of at least 99.995% purity to an oxygen feeding pipe;

reducing the pressure of the oxygen in said oxygen feeding pipe with a reduction valve;

supplying the oxygen passing through the reduction valve to a mixer;

supplying an other high purity gas of nitrogen, helium, argon or carbon dioxide having a purity higher than 99.99% to the mixer;

reducing the pressure of said other high purity gas with a reduction valve located upstream of said mixer;

mixing the oxygen and said other high purity gas at said mixer to produce a gas mixture of 1% to 10% by volume of said other high purity gas; and ozonizing the mixture between a pair of electrode plates to produce high concentration ozone which does not decrease in concentration over time.

6. The system for generating high concentration ozone according to claim 5, where the other high purity gas is argon.

7. A system for generating high concentration ozone which substantially does not change with a lapse of time, comprising:

a high purity oxygen source providing oxygen of a purity higher than 99.995% through an oxygen feeding pipe;

a mixer for receiving the high purity oxygen from the high purity oxygen source;

a source of a second high purity gas of nitrogen, helium, argon or carbon dioxide connected to the mixer and providing the second high purity gas thereto, said second high purity gas having a purity higher than 99.99%;

wherein the mixer mixes the high purity oxygen with said second high purity gas to produce a gas mixture comprising 1% to 10% of the second high purity gas;

a flow meter for measuring the flow of said gas mixture through said mixer; and a silent discharge type ozone generator connected to said oxygen feeding pipe downstream of said mixer for ozonizing said gas mixture to yield an ozone concentration which does not decrease over time.

8. The system for generating high concentration ozone according to claim 7, where the second high purity gas is argon.

* * * * *